(12) United States Patent
Chiu

(10) Patent No.: US 8,076,995 B2
(45) Date of Patent: Dec. 13, 2011

(54) INTEGRATED DIGITALLY CONTROLLED LINEAR-IN-DECIBELS ATTENUATOR

(75) Inventor: Hon Kin Chiu, Castro Valley, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 107 days.

(21) Appl. No.: 12/719,432

(22) Filed: Mar. 8, 2010

(65) Prior Publication Data

US 2010/0164656 A1 Jul. 1, 2010

Related U.S. Application Data

(63) Continuation of application No. 11/876,482, filed on Oct. 22, 2007, now Pat. No. 7,675,380, which is a continuation-in-part of application No. 11/500,024, filed on Aug. 7, 2006, now abandoned, which is a continuation-in-part of application No. 11/160,210, filed on Jun. 14, 2005, now abandoned.

(51) Int. Cl.
*H03G 3/20* (2006.01)

(52) U.S. Cl. ..................... 333/81 R; 327/308

(58) Field of Classification Search ............... 333/81 R; 330/254, 256; 327/308
See application file for complete search history.

(56) References Cited

U.S. PATENT DOCUMENTS

| | | | |
|---|---|---|---|
| 4,810,949 A | 3/1989 | Schiemenz et al. | |
| 5,263,092 A | 11/1993 | Jang | |
| 5,351,030 A | 9/1994 | Kobayashi et al. | |
| 5,408,199 A | 4/1995 | Nagano et al. | |
| 5,757,220 A | 5/1998 | Murden et al. | |
| 6,163,288 A | 12/2000 | Yoshizawa | |
| 6,693,491 B1 | 2/2004 | Delano | |
| 7,253,700 B1 | 8/2007 | Chiu | |
| 2007/0069934 A1 | 3/2007 | Mills et al. | |
| 2007/0090877 A1 | 4/2007 | Bagheri et al. | |

OTHER PUBLICATIONS

International Search Report corresponding to International Application No. PCT/US2008/080759, dated Dec. 22, 2008, 2 pages.
Written Opinion corresponding to International Application No. PCT/US2008/080759, dated Dec. 22, 2008, 7 pages.
Baldwin, Gary L., "An MOS Digitally Controlled Analog Attenuator for Voiceband Signals," IEEE, vol. COM-27, No. 2, Feb. 1979, pp. 332-337.
Hynes, Michael J., et al., "A COMOS Digitally Controlled Audio Attenuator for Hi-Fi Systems," IEEE, vol. SC-16, No. 1, Feb. 1981, pp. 15-20.
Wikffebuttel, "Digitally Programmable Accurate Current Sources for Logarithmic Control of the Amplification or . . . ," IEEE vol. 23, No. 3, Jun. 1988, pp. 767-773.
Newman, Eric J., "X-Amp, A New 45-dB, 500-MHz Variable-Gain Amplifier (VGA) Simplifies Adaptive Receiver Designs," Analog Dialog 36-01 (2002), pp. 1-3.

*Primary Examiner* — Stephen Jones

(57) ABSTRACT

An integrated digitally controlled linear-in-decibels attenuator circuit in which one or more sets of selection switches establish a desired attenuation by selectively connecting the input signal electrode to one or more corresponding resistive ladder networks connected in series, thereby providing a substantially more constant signal attenuation value over a wider frequency bandwidth. With a single resistive ladder network, attenuation control is achieved using a thermometer switching code. With multiple resistive ladder networks, coarse and fine attenuation control can be achieved using thermometer and bubble switching codes, respectively.

12 Claims, 5 Drawing Sheets

| Coarse Attenuation in dB | Switch S5 | Switch S4 | Switch S3 | Switch S2 | Switch S1 |
|---|---|---|---|---|---|
| 3 | 1 | 1 | 1 | 1 | 1 |
| 6 | 1 | 1 | 1 | 1 | 0 |
| 9 | 1 | 1 | 1 | 0 | 0 |
| 12 | 1 | 1 | 0 | 0 | 0 |
| 15 | 1 | 0 | 0 | 0 | 0 |
| 18 | 0 | 0 | 0 | 0 | 0 |

| Fine Attenuation in dB | Switch S1 | Switch S2 | Switch S3 | Switch S4 | Switch S5 | Switch S6 | Switch S7 |
|---|---|---|---|---|---|---|---|
| 0 | 0 | 0 | 0 | 0 | 0 | 0 | 1 |
| 0.5 | 0 | 0 | 0 | 0 | 1 | 1 | 0 |
| 1 | 0 | 0 | 0 | 1 | 0 | 0 | 0 |
| 1.5 | 0 | 0 | 1 | 0 | 0 | 0 | 0 |
| 2 | 0 | 1 | 0 | 0 | 0 | 0 | 0 |
| 2.5 | 0 | 0 | 0 | 0 | 0 | 0 | 0 |
| 3 (Optional) | 1 | 0 | 0 | 0 | 0 | 0 | 0 |

Total Attenuation = Coarse Attenuation + Fine Attenuation

FIG. 5

INTEGRATED DIGITALLY CONTROLLED LINEAR-IN-DECIBELS ATTENUATOR

CROSS-REFERENCE TO RELATED APPLICATIONS

This application is a continuation of U.S. patent application Ser. No. 11/876,482 filed Oct. 22, 2007 now U.S Pat. No. 7,675,380, which is a Continuation-In-Part of U.S. patent application Ser. No. 11/500,024 filed Aug. 7, 2006 now abandoned, which is a Continuation-In-Part of U.S. patent application Ser. No. 11/160,210 filed Jun. 14, 2005 now abandoned, disclosures of which are incorporated by reference herein in their entirety.

BACKGROUND

1. Field of the Invention

The present invention relates to signal attenuation circuits, and in particular, to digitally controlled signal attenuation circuits.

2. Description of the Related Art

Digitally controlled attenuator circuits are well-known in the art. Such attenuator circuits are generally used in controlled impedance environments, and allow the attenuation to be controlled in units or fractions of decibels (dB). One particular type of such attenuator is referred to as a linear-in-dB attenuator, in which a thermometer code type of switching, or control, signal causes the attenuation to vary in single dB steps.

Referring to FIG. 1, a conventional digitally controlled linear-in-dB attenuator includes a resistive ladder circuit with series resistances Rs2-Rs7 and shunt resistances Rp1-Rp7, interconnected substantially as shown, to which the input voltage signal Vin is applied. The voltages at nodes N1-N7 are applied to the throw electrodes of the single-pole, single-throw switch circuits S1-S7. The pole electrodes of these switches S1-S7 are mutually connected to provide the output signal Vout. The switches S1-S7 are controlled with a thermometer code control signal to selectively close the individual switches, depending upon the desired attenuation. (As one example embodiment, the series resistances Rs2-Rs7 would have nominal resistance values of 109 ohms, while the shunt resistances Rp1-Rp7 would have nominal resistances of 8170 ohms.)

Referring to FIG. 1A, a problem with such conventional attenuator circuits is the limited bandwidth caused by the circuit topology. As seen in FIG. 1A, at or near a certain frequency Fc, the attenuation is no longer constant and begins to increase. This is due to the switch circuits S1-S7, which are typically implemented using metal oxide semiconductor field effect transistor (MOSFET) switches with low turn-on resistances. As is well-known in the art, such devices typically have relatively high parasitic capacitances at their drain and source electrodes. It is this parasitic capacitance that causes the bandwidth to be limited, thereby causing the attenuation characteristics to no longer be constant above a certain frequency Fc. Further, also as shown in FIG. 1A, the bandwidth decreases as the attenuation increases. This is caused by the increased capacitance due to more of the switches S1-S7 being in their off states.

SUMMARY OF THE INVENTION

An integrated digitally controlled linear-in-decibels attenuator circuit in which one or more sets of selection switches establish a desired attenuation by selectively connecting the input signal electrode to one or more corresponding resistive ladder networks connected in series, thereby providing a substantially more constant signal attenuation value over a wider frequency bandwidth. With a single resistive ladder network, attenuation control is achieved using a thermometer switching code. With multiple resistive ladder networks, coarse and fine attenuation control can be achieved using thermometer and bubble switching codes, respectively.

In accordance with one embodiment of the presently claimed invention, an integrated digitally controlled linear-in-decibels attenuator circuit includes:

a plurality of attenuation control electrodes to convey a plurality of digital control signals corresponding to a signal attenuation value in accordance with a thermometer code;

an input signal electrode to convey an input signal having a magnitude; an output signal electrode to convey an output signal corresponding to the input signal and having a magnitude which is less than the input signal magnitude in relation to the signal attenuation value; and a resistive network coupled between the input and output signal electrodes and responsive to the plurality of digital control signals by attenuating the input signal to provide the output signal.

In accordance with another embodiment of the presently claimed invention, an integrated digitally controlled linear-in-decibels attenuator circuit includes:

a first plurality of attenuation control electrodes to convey a first plurality of digital control signals corresponding to a first signal attenuation value in accordance with a thermometer code;

a second plurality of attenuation control electrodes to convey a second plurality of digital control signals corresponding to a second signal attenuation value in accordance with a bubble code;

an input signal electrode to convey an input signal having a magnitude;

an intermediate signal electrode to convey an intermediate signal corresponding to the input signal and having a magnitude which is less than the input signal magnitude in relation to the first signal attenuation value;

an output signal electrode to convey an output signal corresponding to the intermediate signal and having a magnitude which is less than the intermediate signal magnitude in relation to the second signal attenuation value;

a first resistive ladder network coupled between the input and intermediate signal electrodes and responsive to the first plurality of digital control signals by attenuating the input signal to provide the intermediate signal; and a second resistive ladder network coupled between the intermediate and output signal electrodes and responsive to the second plurality of digital control signals by attenuating the intermediate signal to provide the output signal.

BRIEF DESCRIPTION OF THE DRAWINGS

FIG. 5 is a table of thermometer and bubble codes for attenuator control signals in accordance with one embodiment of the presently claimed invention.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 2A:
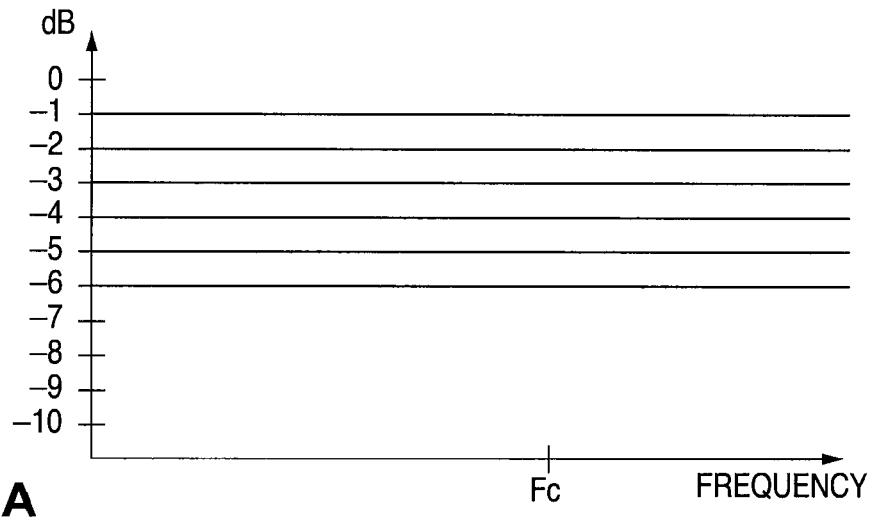
FIG. 2A is a graph of attenuation versus frequency for the circuit of FIG. 2.
Figure 2:
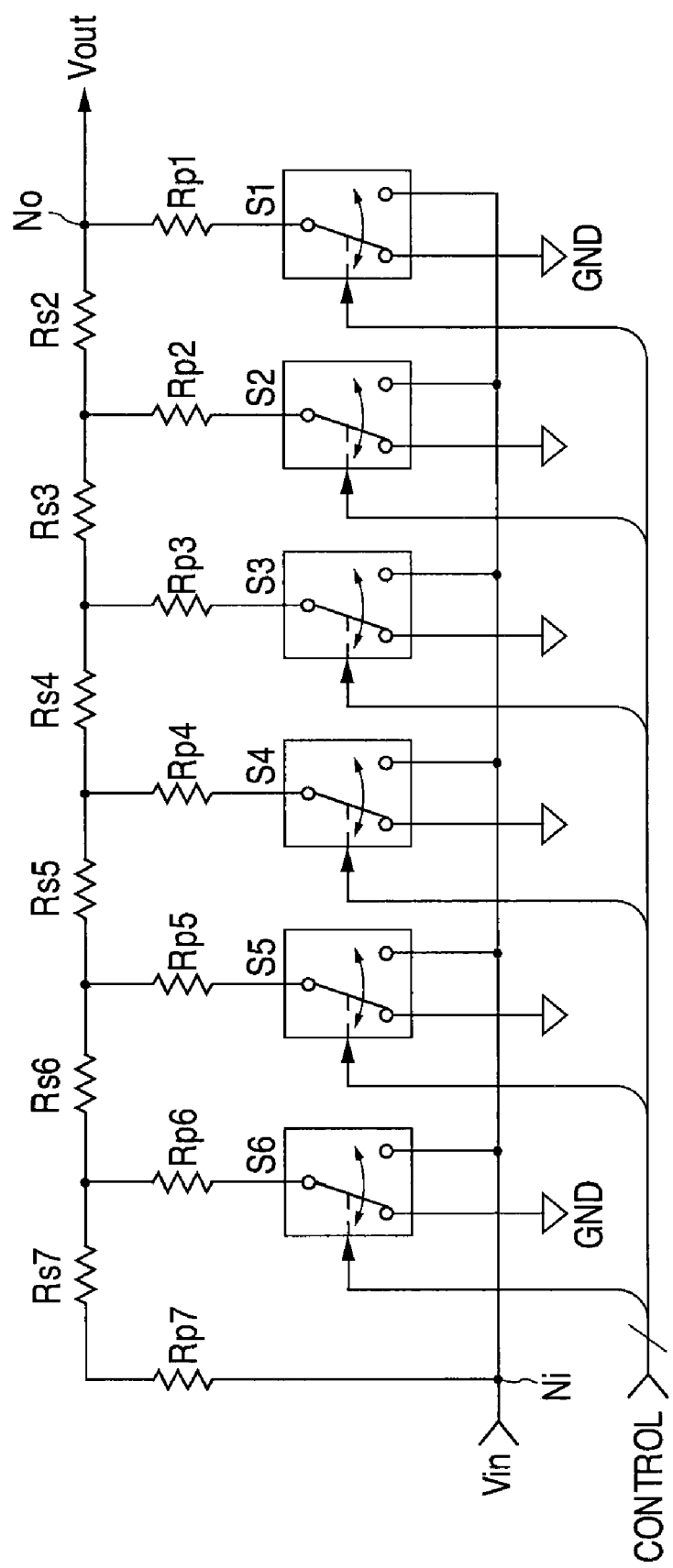
FIG. 2 is a schematic diagram of a digitally controlled linear-in-dB attenuator circuit in accordance with one embodiment of the presently claimed invention.

Referring to FIG. 2, an integrated digitally controlled linear-in-dB attenuator circuit in accordance with one embodiment of the presently claimed invention includes a resistive ladder circuit, with series resistances Rs2-Rs7 and shunt resistances Rp1-Rp7, and single-pole, double-throw switch circuits S1-S6, all interconnected substantially as shown. (It will be understood by one of ordinary skill in the art that fewer or more series and shunt resistances and switch circuits can be used in accordance with the number of dB steps of attenuation desired.) The input signal Vin is applied to the series resistances Rs2-Rs7 via resistance Rp7, and to resistances Rp1-Rp6 via the switch circuits S1-S6. Accordingly, the output signal Vout is provided at the output of the resistive ladder circuit (e.g., as opposed to the mutually connected pole electrodes of the switch circuits S1-S6). In conformance with Thevenin's Theorem, this circuit topology advantageously maintains a sufficient output impedance at the output node No since the pole electrodes of the switch circuits S1-S6 are isolated from the output node No by the shunt Rp1-Rp6 and series Rs2-Rs6 resistances, and the throw electrodes are connected either to the low impedance input node Ni or to low impedance circuit ground GND, depending upon the desired signal attenuation.

Referring to FIG. 2A, as a result of this circuit topology, the signal attenuation remains more constant over a wider frequency bandwidth due to the isolation of the parasitic capacitances of the switch circuits S1-S6 from the output node No.

Figure 3:
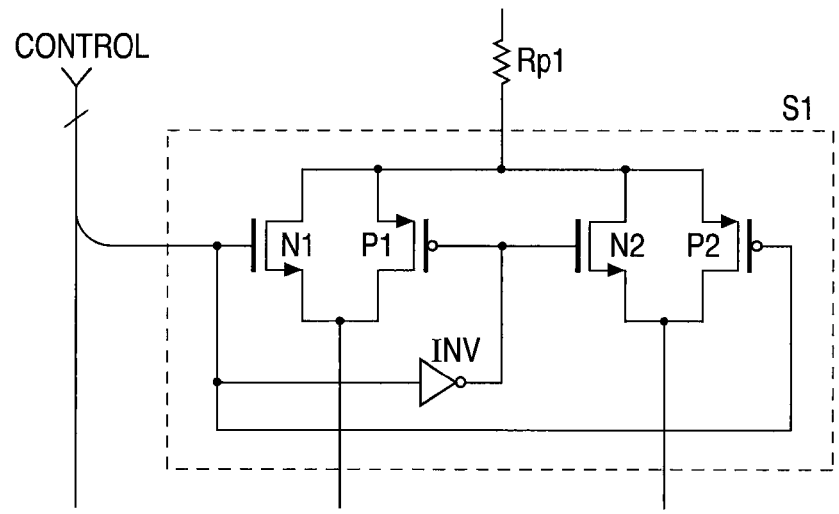
FIG. 3 is a schematic diagram of one example of an implementation of a switch circuit for the attenuator circuit of FIG. 2.

Referring to FIG. 3, an example embodiment of a switch circuit, e.g., the first switch circuit S1, includes pairs of N-type and P-type MOSFETs interconnected as transmission gates. For example, complementary pairs N1, P1 and N2, P2 of MOS transistors are interconnected with mutually coupled drain and source electrodes as shown. The incoming control signal drives the gate electrodes of transistors N1 and P2, while the inverted control signal (inverted by an inverter circuit INV) drives the gate electrodes of transistors P1 and N2. Hence, when the control signal is asserted high, the N1-P1 transistor pair is turned on while the N2-P2 transistor pair is turned off. Conversely, when the control signal is de-asserted low, transistor pair N2-P2 is turned on while transistor pair N1-P1 is turned off. Alternatively, instead of transmission gates, single transistors can be used as pass transistors. For example, transistors N1 and P2 can be used with transistors P1 and N2 omitted.

Figure 1:
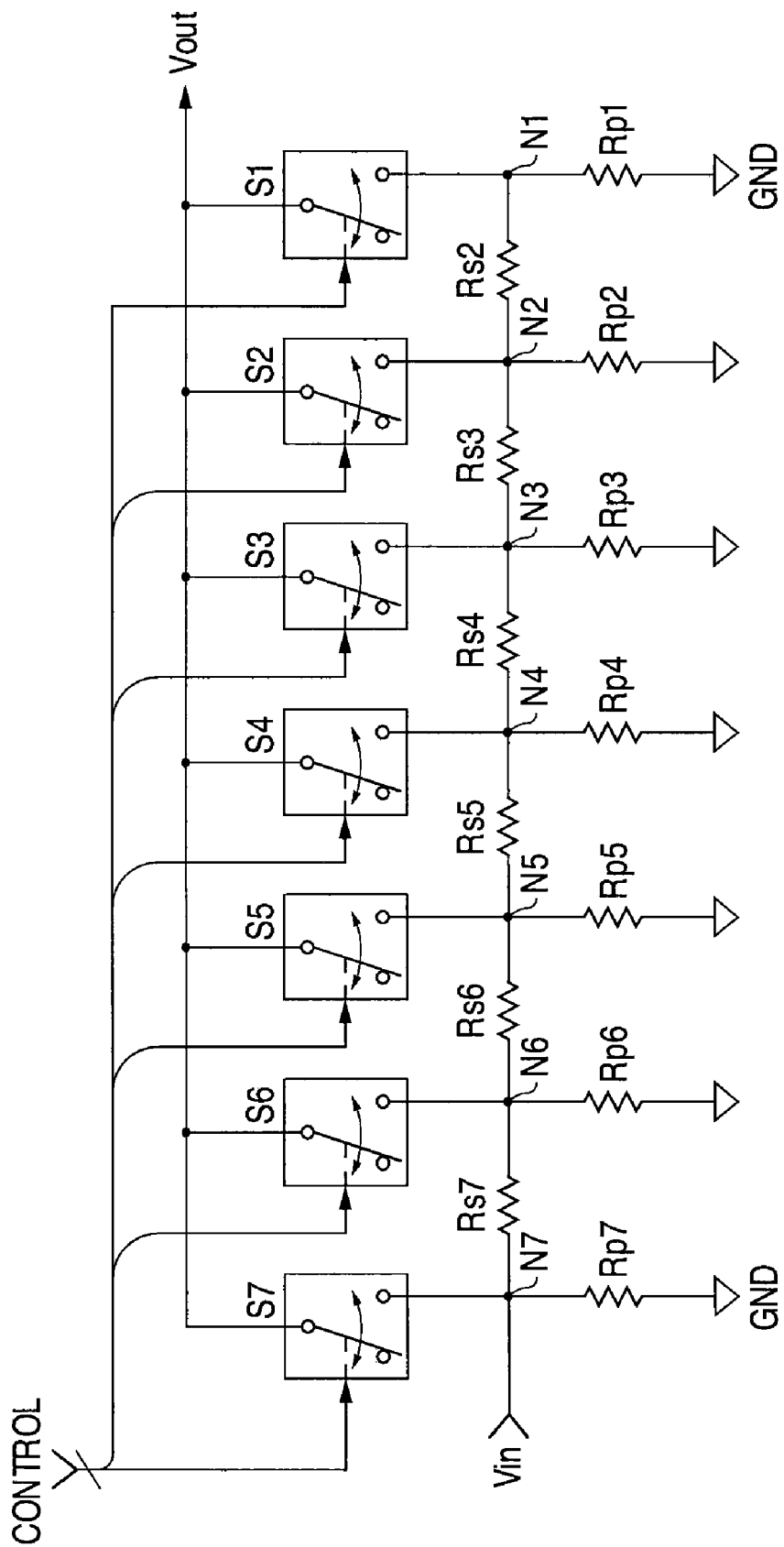
FIG. 1 is a schematic diagram of a conventional digitally controlled linear-in-dB attenuator circuit.
Figure 1A:
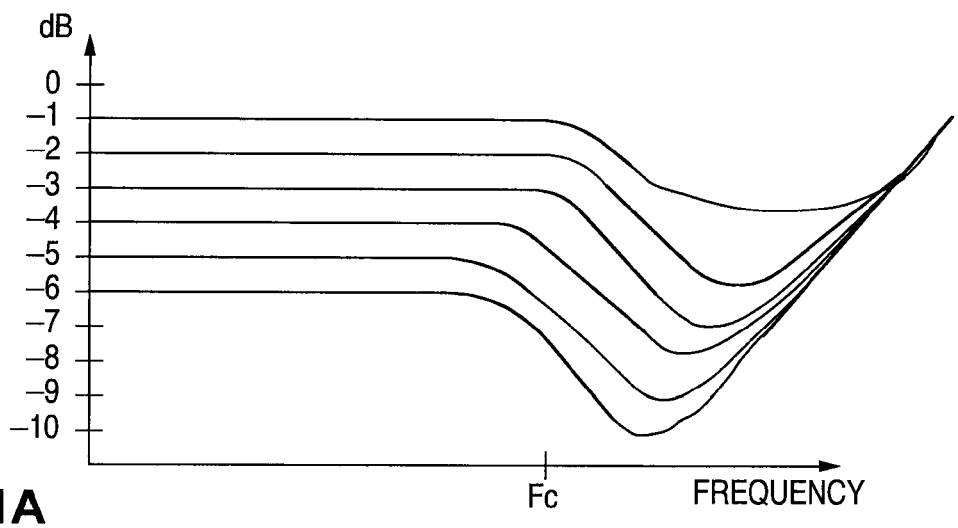
FIG. 1A is a graph of attenuation versus frequency for the circuit of FIG. 1.
Figure 4:
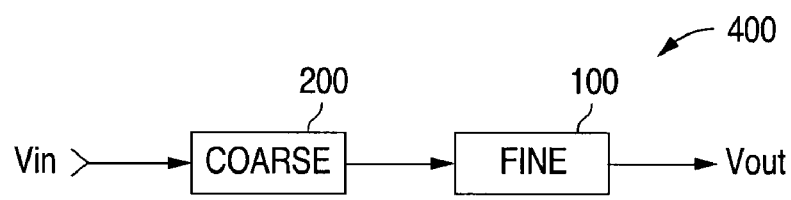
FIG. 4 is a block diagram of a digitally controlled linear-in-dB attenuator circuit in accordance with another embodiment of the presently claimed invention.

Referring to FIG. 4, a digitally controlled linear-in-dB attenuator circuit 400 in accordance with another embodiment of the presently claimed invention includes at least two stages 200, 100 connected in series, with the first stage 200 being a circuit in conformance with FIG. 2, and the second stage 100 being a circuit in conformance with FIG. 1 (with the output node No of FIG. 2 connected to the input node N7 of FIG. 1). Accordingly, with the two stages 200, 100 implemented as the example circuits of FIGS. 2 and 1, the first stage 200 will have M=6 stages of resistive attenuators (as well as M=6 switches) for M steps of coarse adjustment, and the second stage 100 will have N=7 stages of resistive attenuators (as well as N=7 switches) for N steps of fine adjustment. This results in having M*N=42 possible adjustments while needing only M+N=13 stages of resistive attenuators (with M+N=13 switches), which is significantly less than M*N=42 stages of resistive attenuators (as well as M*N=42 switches) as required in a conventional linear-in-dB attenuator circuit.

Based upon a reference resistance value Rref, preferred relative values of the resistances in the first stage 200 (Rs2-Rs7 and Rp1-Rp7) and second stage 100 (Rs2-Rs7 and Rp1-Rp7) are as follows (where a<1 and k<1):

First Stage 200

$$Rs2=Rs3=Rs4=Rs5=Rs6=Rs7=Rref/a-Rref$$

$$Rp1=Rp2=Rp3=Rp4=Rp5=Rp6=Rp7=Rref/(1-a)$$

Second Stage 100

$$Rs2=Rs3=Rs4=Rs5=Rs6=Rs7=Rref$$

$$Rp1=Rp2=Rp3=Rp4=Rp5=Rp6=Rp7=(Rref*k/(1-k))$$
$$*((Rref*k/(1-k))+Rref)/Rref$$

For example, with a reference resistance value of Rref=500, and a=0.9441 and k=0.7079, coarse and fine steps of 3 dB and 0.5 dB, respectively, can be realized.

While the minimum attenuation of such an attenuator circuit 400 is equal to one coarse attenuation step and not zero (0 dB), due to resistors Rp7 and Rs2-Rs7 in the first stage 200 (FIG. 2), it will be readily appreciated by one of ordinary skill in the art that such minimum signal loss can be compensated by the gain of an output buffer amplifier (not shown) following the second attenuator stage 100.

Referring to FIG. 5, in accordance with one embodiment of the presently claimed invention, the attenuator control signals, i.e., the switch control signals CONTROL (FIGS. 1 and 2), for a digitally controlled linear-in-dB attenuator circuit 400 in accordance with FIG. 4 would be as shown for a first stage 200 having M=5 stages of resistive attenuators and M=5 switches for M steps of coarse adjustment (i.e., switch S6 and resistances Rp6, Rp7 and Rs7 are not used, and the input signal Vin is applied to resistance Rs6), and a second stage 100 having N=7 stages of resistive attenuators and N=7 switches for N steps of fine adjustment. Also in accordance with the presently claimed invention, the first stage 200 provides coarse attenuation control in accordance with thermometer code, while the second stage 100 provides fine attenuation control in accordance with bubble code.

In the case of the first stage 200 providing coarse attenuation control, an advantage to using thermometer code for such a R-2R resistive ladder network is the ability to provide linear-in-dB attenuation. This is in contrast to the use of binary code which would provide linear-in-voltage control.

Figure 6:
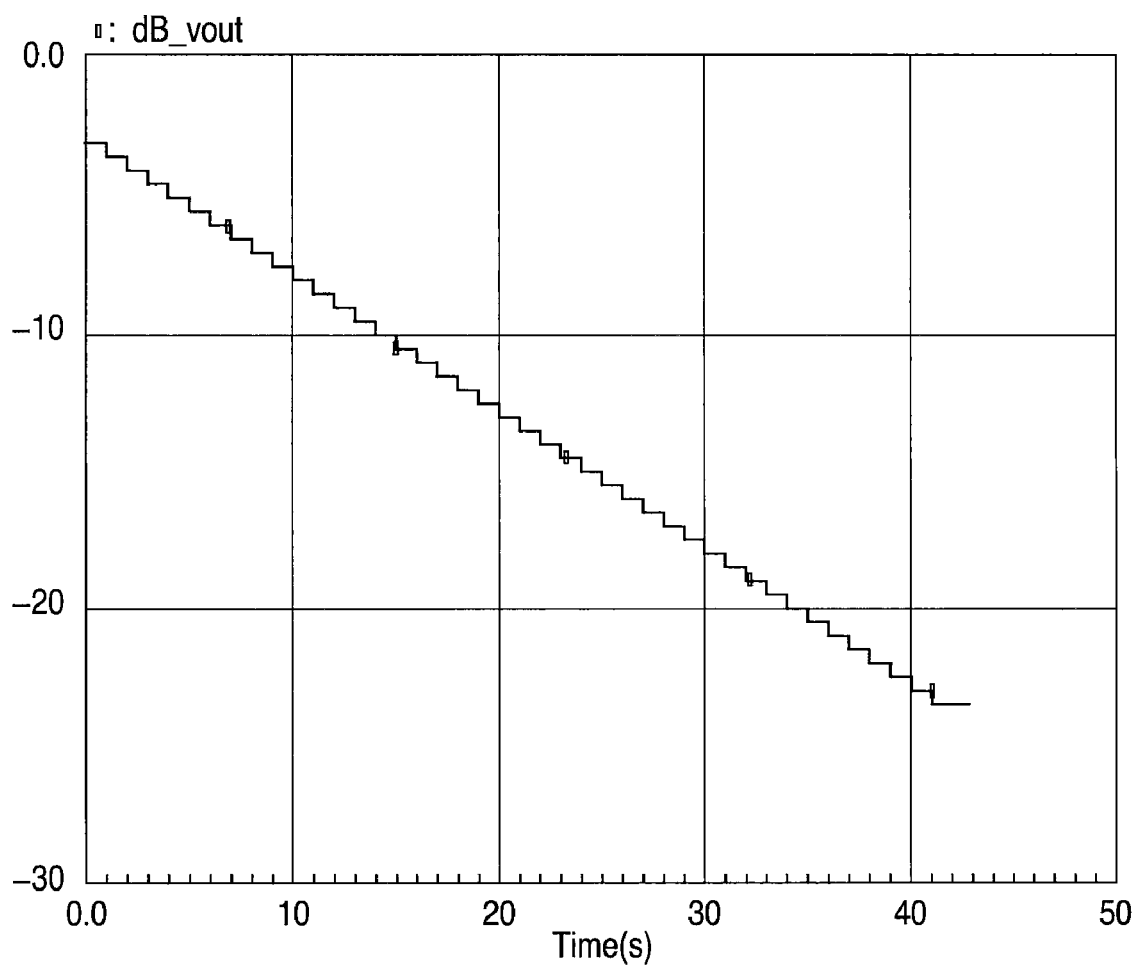
FIG. 6 is a graph of attenuation levels versus time for the attenuator circuit of FIG. 4 with the attenuator control signals of FIG. 5.

Referring to FIG. 6, attenuation levels versus time are shown for the attenuator circuit of FIG. 4 using the thermometer and bubble codes of FIG. 5 for the attenuator control signals.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated digitally controlled linear-in-decibels attenuator circuit, comprising:
    first switched resistance circuitry responsive to a first plurality of digital control signals by attenuating an input signal to provide a first attenuated signal having a magnitude substantially in accordance with one of a first plurality of attenuation values mutually separated by a first attenuation step substantially in accordance with a thermometer code; and
    second switched resistance circuitry coupled to said first switched resistance circuitry and responsive to a second plurality of digital control signals by attenuating said first attenuated signal to provide a second attenuated signal having a magnitude substantially in accordance with one of a second plurality of attenuation values mutually separated by a second attenuation step substantially in accordance with a bubble code, wherein said second attenuation step is smaller than said first attenuation step;
    wherein a ratio of said second attenuated signal and said input signal is one of a plurality of ratio values mutually separated by linear-in-decibels steps.

2. The apparatus of claim 1, wherein:
    said first plurality of attenuation values comprises M attenuation values;
    said second plurality of attenuation values comprises N attenuation values; and
    said plurality of ratio values comprises M*N attenuation values.

3. The apparatus of claim 1, wherein:
    said first switched resistance circuitry includes M stages of switched resistances;
    said second switched resistance circuitry includes N stages of switched resistances; and
    said first and second switched resistance circuitries together provide M*N attenuation values.

4. The apparatus of claim 1, wherein:
    said first switched resistance circuitry includes
        a first plurality of series resistances each of which having a resistance $Rs1$ related to a reference resistance $Rr$ and a first scalar $A$ substantially in accordance with $Rs1=Rr/A-Rr$, and
        a first plurality of shunt resistances each of which having a resistance $Rp1$ related to said reference resistance $Rr$ and said first scalar $A$ substantially in accordance with $Rp1=Rr/(1-A)$; and
    said second switched resistance circuitry includes
        a second plurality of series resistances each of which having a resistance $Rs2$ substantially equal to said reference resistance $Rr$, and
        a second plurality of shunt resistances each of which having a resistance $Rp2$ related to said reference resistance $Rr$ and a second scalar $K$ substantially in accordance with $Rp2=(Rr*K/(1-K))*((Rr*K/(1-K))+Rr)/Rr$.

5. The apparatus of claim 1, wherein:
    said first switched resistance circuitry is responsive to said first plurality of digital control signals during a first time interval such that said first attenuated signal magnitude transitions through a first plurality of signal magnitudes; and
    said second switched resistance circuitry is responsive to said second plurality of digital control signals during a second time interval such that said second attenuated signal magnitude transitions through a second plurality of signal magnitudes.

6. The apparatus of claim 5, wherein:
    said first plurality of signal magnitudes are mutually related by said first attenuation step; and
    said second plurality of signal magnitudes are mutually related by said second attenuation step.

7. A method for attenuating a signal in a linear-in-decibels manner in accordance with a plurality of digital control signals, comprising:
    attenuating an input signal in accordance with a first plurality of digital control signals to provide a first attenuated signal having a magnitude substantially in accordance with one of a first plurality of attenuation values mutually separated by a first attenuation step substantially in accordance with a thermometer code; and
    attenuating said first attenuated signal in accordance with a second plurality of digital control signals to provide a second attenuated signal having a magnitude substantially in accordance with one of a second plurality of attenuation values mutually separated by a second attenuation step substantially in accordance with a bubble code, wherein said second attenuation step is smaller than said first attenuation step;
    wherein a ratio of said second attenuated signal and said input signal is one of a plurality of ratio values mutually separated by linear-in-decibels steps.

8. The method of claim 7, wherein:
    said first plurality of attenuation values comprises M attenuation values;
    said second plurality of attenuation values comprises N attenuation values; and
    said plurality of ratio values comprises M*N attenuation values.

9. The method of claim 7, wherein:
    said attenuating an input signal comprises switching said input signal among M stages of switched resistances;
    said attenuating said first attenuated signal comprises switching said first attenuated signal among N stages of switched resistances; and said M and N stages of switched resistances together provide M*N attenuation values.

10. The method of claim 7, wherein:

said attenuating an input signal comprises switching said input signal among M stages of switched resistances including
- a first plurality of series resistances each of which having a resistance Rs1 related to a reference resistance Rr and a first scalar A substantially in accordance with $Rs1=Rr/A-Rr$, and
- a first plurality of shunt resistances each of which having a resistance Rp1 related to said reference resistance Rr and said first scalar A substantially in accordance with $Rp1=Rr/(1-A)$; and said attenuating said first attenuated signal comprises switching said first attenuated signal among N stages of switched resistances including
- a second plurality of series resistances each of which having a resistance Rs2 substantially equal to said reference resistance Rr, and
- a second plurality of shunt resistances each of which having a resistance Rp2 related to said reference resistance Rr and a second scalar K substantially in accordance with $Rp2=(Rr*K/(1-K))*((Rr*K/(1-K))+Rr)/Rr$.

11. The method of claim 7, wherein:

said attenuating an input signal comprises attenuating said input signal in accordance with said first plurality of digital control signals during a first time interval such that said first attenuated signal magnitude transitions through a first plurality of signal magnitudes; and said attenuating said first attenuated signal comprises attenuating said first attenuated signal in accordance with said second plurality of digital control signals during a second time interval such that said second attenuated signal magnitude transitions through a second plurality of signal magnitudes.

12. The method of claim 11, wherein:

said first plurality of signal magnitudes are mutually related by said first attenuation step; and said second plurality of signal magnitudes are mutually related by said second attenuation step.

\* \* \* \* \*